United States Patent
Goldberg et al.

(10) Patent No.: US 7,087,913 B2
(45) Date of Patent: Aug. 8, 2006

(54) ION IMPLANTER ELECTRODES

(75) Inventors: Richard David Goldberg, Hove (GB); David George Armour, Turton (GB); Christopher Burgess, Hove (GB); Adrian J. Murrell, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 176 days.

(21) Appl. No.: 10/696,782

(22) Filed: Oct. 29, 2003

(65) Prior Publication Data

US 2005/0082497 A1 Apr. 21, 2005

Related U.S. Application Data

(63) Continuation-in-part of application No. 10/688,072, filed on Oct. 17, 2003, now abandoned.

(51) Int. Cl.
*H01J 37/147* (2006.01)
*H01J 37/30* (2006.01)

(52) U.S. Cl. .............................. 250/492.21; 250/492.2; 250/492.1; 250/398

(58) Field of Classification Search ............. 250/492.1, 250/492.2, 492.21, 398, 423 R, 397
See application file for complete search history.

(56) References Cited

U.S. PATENT DOCUMENTS

| | | | |
|---|---|---|---|
| 4,450,031 A | 5/1984 | Ono et al. | |
| 4,595,837 A * | 6/1986 | Wu et al. ................. | 250/492.2 |
| 4,684,848 A | 8/1987 | Kaufman et al. | |
| 4,804,852 A * | 2/1989 | Rose et al. .............. | 250/492.1 |
| 5,132,544 A * | 7/1992 | Glavish ................... | 250/492.2 |
| 5,306,920 A | 4/1994 | King et al. | |
| 5,350,924 A | 9/1994 | Stengl et al. | |
| 5,420,415 A * | 5/1995 | Trueira ................... | 250/492.21 |
| 5,808,310 A | 9/1998 | Yamashita et al. | |
| 5,811,820 A | 9/1998 | Kirchner et al. | |
| 5,825,038 A | 10/1998 | Blake et al. | |
| 5,932,882 A * | 8/1999 | England et al. ......... | 250/492.21 |
| 5,962,859 A | 10/1999 | Groves et al. | |
| 5,969,366 A * | 10/1999 | England et al. ......... | 250/492.21 |
| 6,414,329 B1 | 7/2002 | Benveniste et al. | |
| 6,423,976 B1 | 7/2002 | Glavish et al. | |

(Continued)

FOREIGN PATENT DOCUMENTS

EP 0237165 9/1987

(Continued)

OTHER PUBLICATIONS

PCT/US04/33893 International Search Report mailed Jul. 26, 2005 (Atty ID 008446PCTP01).

(Continued)

*Primary Examiner*—Nikita Wells
*Assistant Examiner*—Johnnie L Smith, II
(74) *Attorney, Agent, or Firm*—Konrad Raynes Victor & Mann, LLP

(57) ABSTRACT

Provided is an ion implanter having a deceleration lens assembly comprising a plurality of electrodes in which one or more of the apertures of the deceleration electrodes are shaped in a manner which can improve performance of the ion implanter. In one embodiment, an electrode aperture is generally elliptical in shape and conforms generally to the shape of the beam passing through the aperture. In another aspect, an axis segment extends 40% of the length of the aperture from the aperture center to an intermediate point at the end of the segment. The average width of the aperture measured at each point from the center to the intermediate point is substantially less than the maximum width of the aperture.

25 Claims, 6 Drawing Sheets

U.S. PATENT DOCUMENTS

| | | |
|---|---|---|
| 6,441,382 B1 | 8/2002 | Huang |
| 6,534,775 B1 * | 3/2003 | Harrington et al. .... 250/492.21 |
| 6,777,882 B1 * | 8/2004 | Goldberg et al. ...... 250/492.21 |
| 2003/0066976 A1 * | 4/2003 | Chen et al. ............ 250/492.21 |

FOREIGN PATENT DOCUMENTS

| | | |
|---|---|---|
| EP | 0559359 | 9/1993 |
| JP | 1274352 | 11/1989 |
| JP | 2112140 | 4/1990 |
| WO | 02043803 | 6/2002 |

OTHER PUBLICATIONS

Vitzethum et al. "From High-Speed, High-Gain Photoconductive Receivers to Single-Photon Detectors," Proc. 11th Intl Workshop on Physics of Semiconductor Devices, Dec. 11-15, 2001 - Delhi, India, vol. 1, pp. 3-11; 2002.

* cited by examiner

ION IMPLANTER ELECTRODES

RELATED APPLICATIONS

This application is a continuation-in-part application of parent application entitled "Ion Implanter Electrodes," Ser. No. 10/688,072, filed Oct. 17, 2003, now abandon and assigned to the assignee of the present application.

FIELD OF THE INVENTION

This invention relates to ion implanters for implanting ions into substrates, such as semiconductor wafers, in electronic device fabrication, and in particular to ion implanters capable of processing wafers on a commercial scale.

BACKGROUND

Ion implantation techniques are commonly used as one of the processes employed in the manufacture of integrated circuits, to modify the electrical transport properties in predefined regions of a semiconductor material by doping these regions with a predetermined concentration of impurity atoms. The technique generally involves generating a beam of a preselected specie of ions and directing the beam towards a target substrate. The depth of the ion implant depends, inter alia, on the energy of the ion beam at the substrate. As the density of devices on a single wafer increases and the lateral dimensions of individual devices decrease for ultra-large scale integrated circuits (ULSI), the ability of an ion implanter to form shallow junctions using low energy ions, e.g. of about 0.2 keV to 10 keV, becomes increasingly useful. At the same time, in commercial ion implantation, it is also often useful to be able to process an individual wafer in as short a time as possible. In many applications reduced processing time is achieved by providing a large ion beam current. However, it is often difficult to transport a large current ion beam at low energy due to space charge effects.

U.S. Pat. No. 5,932,882 describes one prior technique in which an ion beam is transported at high energy and then decelerated to a lower energy just before the beam impacts the substrate. The ion implanter of this reference comprises an ion beam generator which includes a source of ions and an extractor electrode assembly for extracting the ions from the source and forming a beam of ions. The extraction electrode assembly comprises one or more electrodes which typically have apertures through which the ion beam is shaped. A magnet adjacent the ion beam generator spatially resolves the beam ions according to their mass. A flight tube transports the beam at a transport energy, and a substrate holder holds a substrate to be implanted with beam ions. A deceleration potential generator connected to apply a deceleration potential to a deceleration lens assembly between the flight tube and the substrate holder decelerates beam ions to a desired implant energy. The deceleration lens assembly located between the flight tube and the substrate holder comprises a plurality of electrodes which typically have apertures through which the ion beam passes.

SUMMARY OF ILLUSRATED EMBODIMENTS

Provided is an ion implanter having a deceleration lens assembly comprising a plurality of electrodes in which one or more of the apertures of the deceleration electrodes are shaped in a manner which can improve performance of the ion implanter. In one embodiment, an electrode aperture is generally elliptical in shape and conforms generally to the shape of the beam passing through the aperture. In some applications, it is believed that an elliptical or similar shape can reduce aberrations in the electric field projected by or otherwise influenced by the apertured electrodes of a deceleration electrode assembly of an ion implanter.

In one illustrated embodiment, an aperture has a periphery which defines a center point A longitudinal axis passes through the center and two end points at opposite ends of the periphery. The maximum length of the aperture is measured along the axis between these periphery end points. A transverse axis also passes through the center point and two periphery midpoints at opposite sides of the aperture. The maximum width of the aperture is measured along the transverse axis between these periphery side points.

In one embodiment, the width of the aperture decreases monotonically from the point of maximum width measured along the transverse axis at the side midpoints, to each aperture endpoint. In another aspect, the average width of the aperture is less than the maximum width of the aperture. In a more detailed embodiment, an axis segment extends 40% of the length of the aperture from the aperture center to an intermediate point at the end of the segment. The average width of the aperture measured at each point from the center to the intermediate point is substantially less than the maximum width of the aperture. In the illustrated embodiment, the average width of the aperture as measured along the points of this segment is in the range of 20–100 mm, depending upon the application of the specific lens element. These lengths may also scale with the machine dimensions.

It is appreciated that aperture shapes which are similar to elliptical may increase beam transmission, reduce aberrations in the electrode electric field or provide other benefits. For example, in one embodiment, an elongated aperture may be nonelliptical but the width of the aperture nonetheless decreases monotonically from the side midpoints to each aperture endpoint in a manner similar to that of an elliptical aperture. Moreover the average width of the aperture measured at each point of an axis segment having a length of 40% of the aperture length from the aperture center to the intermediate point at the end of a segment is substantially less than the maximum width of the aperture.

In yet another embodiment, an aperture which is noncircular, and nonelongated is also believed to improve ion implanter performance. For example, an aperture which is partially square in shape and has four gradually rounded corners. In this embodiment, the width of the aperture decreases monotonically from the maximum width measured along a transverse axis at the side midpoints to each aperture endpoint. Moreover the average width of the aperture measured at each point of an axis segment having a length of 40% of the aperture length from the aperture center to the intermediate point at the end of a segment is substantially less than the maximum width of the aperture. Yet another embodiment may have a circular aperture.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

Examples of embodiments of the present invention will now be described with reference to the drawings in which.

DESCRIPTION OF ILLUSTRATED EMBODIMENTS

Figure 2:
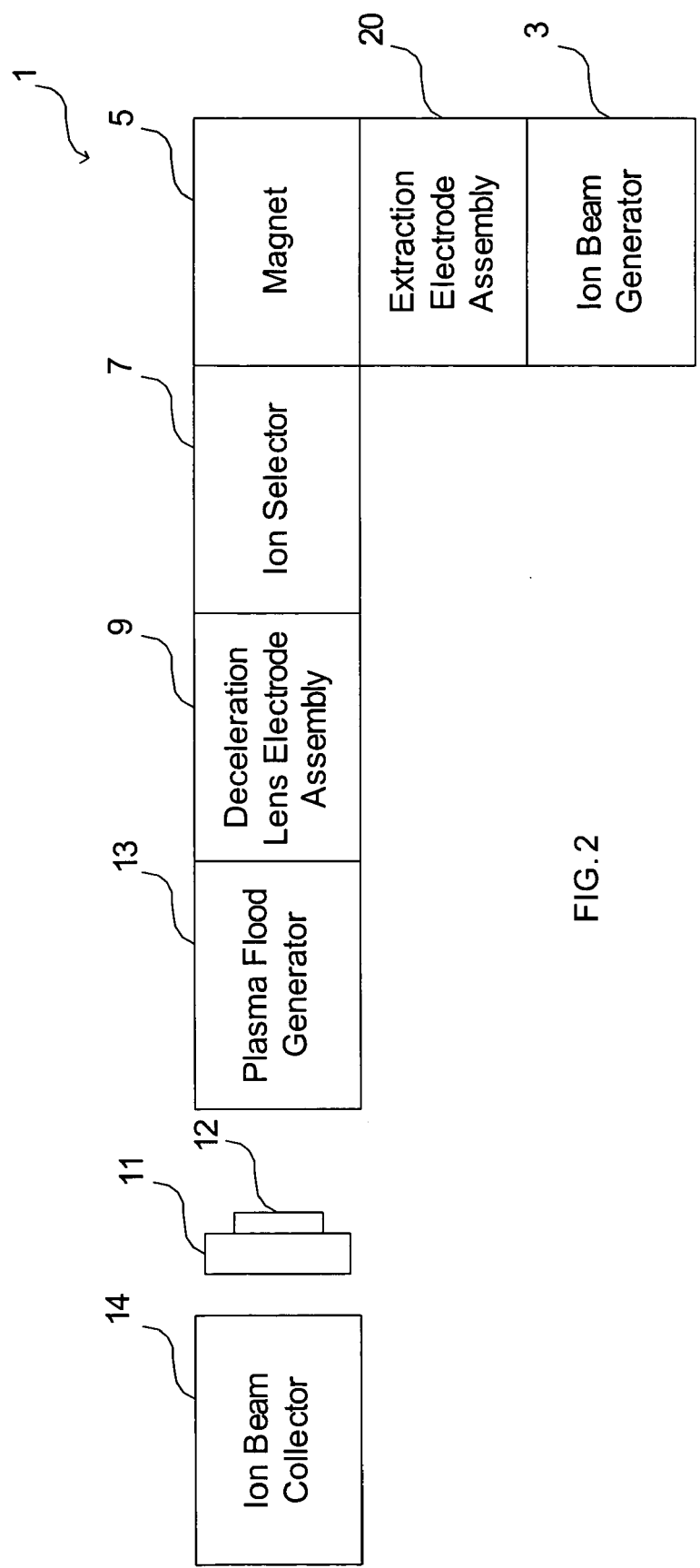
FIG. 2 shows a schematic diagram of one example of an ion implanter which can employ electrodes according to an embodiment of the present invention.

An ion implanter in accordance with one embodiment is indicated generally at 1 in FIG. 2. The ion implanter 1 comprises an ion beam generator 3 for generating a beam of ions. A magnet 5 adjacent the ion beam generator spatially resolves the beam ions according to their mass. An ion selector 7 disposed adjacent the analyzing magnet 5 is used to select a specie of ions to be implanted into a target substrate and rejects other ions that have been spatially resolved from them by the magnet. A deceleration lens electrode assembly 9 disposed adjacent the ion selector 7 controls the final energy of the ion beam before implantation by retarding the velocity of the ions. A screening assembly positioned between the ion selector 7 and the electrode assembly 9 reduces penetration of the electric field from the electrode assembly 9 into the ion selector 7. A support or holder 11 spaced from the electrode assembly 9 supports a target substrate 12 to be implanted with beam ions. The implanter 1 may be a batch system that implants batches of wafers or a single wafer system. A plasma flood generator 13 disposed between the electrode assembly 9 and the substrate support 11 introduces electrons and other charged particles into the ion beam near the target surface to neutralize the beam and wafer surface. An ion beam collector 14 positioned downstream of the substrate support 11 serves as a beam stop and ion current detector for dosimetry measurements.

Referring to FIGS. 3 to 7, the deceleration lens electrode assembly 9 comprises a prefocusing apertured plate electrode 60 and a field or focusing electrode 61 located adjacent to the apertured plate electrode 60 which provides a focusing field for beam ions of a beam 146 passing through an aperture 62 of the first apertured plate electrode 60. The field electrode 61 has a generally circular symmetry and defines an aperture 63 adjacent and substantially coaxial with the exit aperture 62 of the plate electrode 60 of the screening assembly. In alternative embodiments, the electrodes may have shapes other than circular and may be offset from each other or twisted with respect to each other to provide beam steering. The deceleration lens assembly further comprises an apertured ground plate electrode 65 that is at the potential of the target. In the current embodiment, the target is maintained at ground potential. It is appreciated of course that other potentials may be utilized. The ground plate electrode 65 is disposed generally transverse to the beam 146 and defines a further aperture 67 through which the ion beam can pass, this further aperture 67 being disposed adjacent the field electrode aperture 63. It is appreciated that the electrodes may be disposed in other positions relative to the beam and each other.

Figure 1:
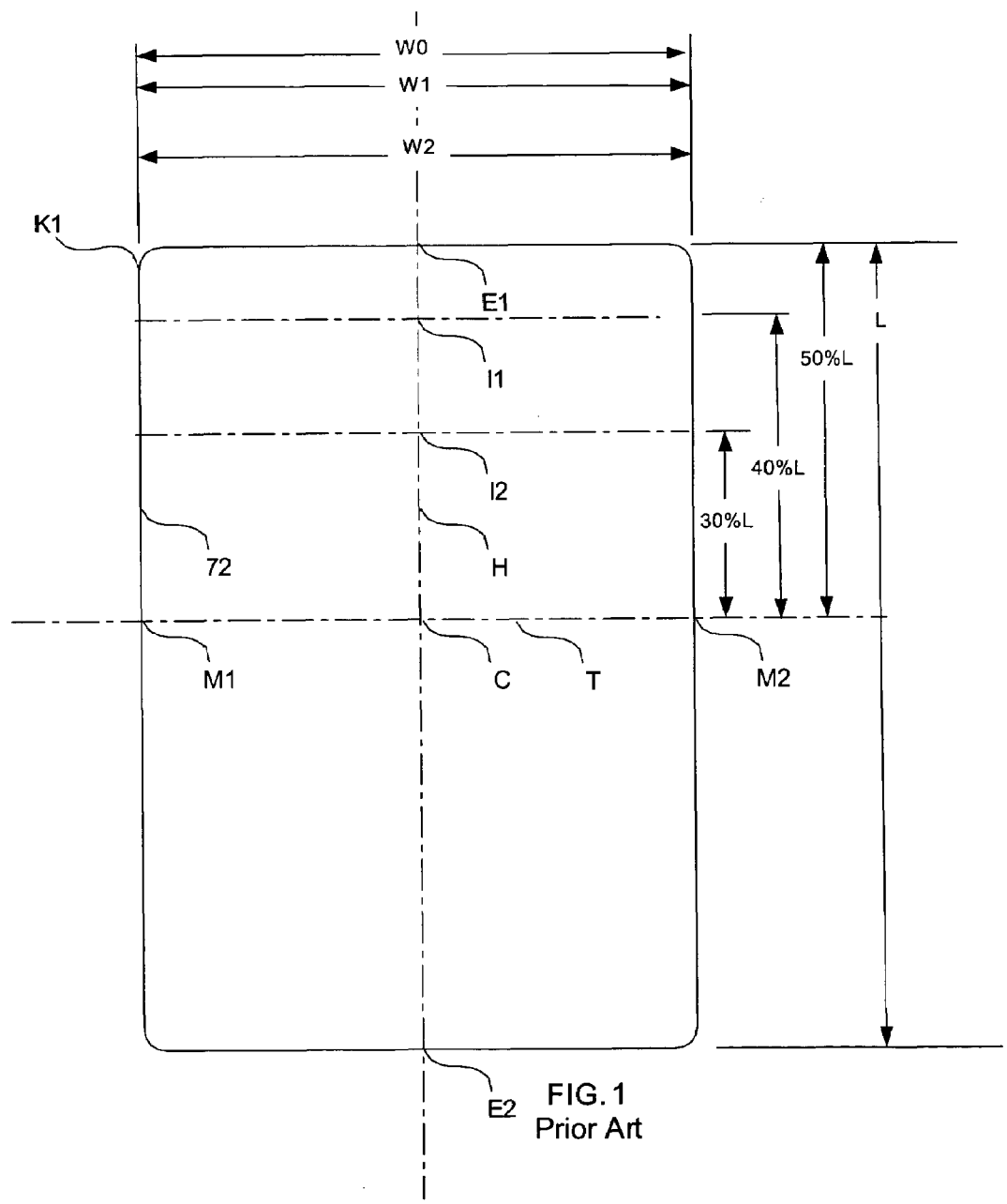
FIG. 1 is a schematic diagram of a prior art aperture for a deceleration electrode.
Figure 4:
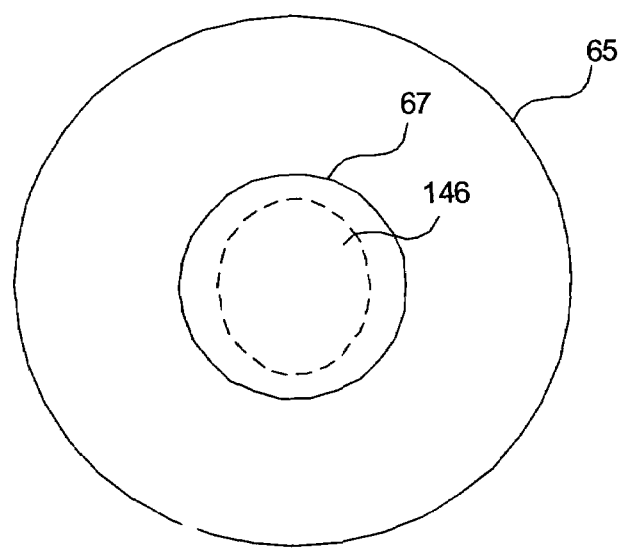
FIG. 4 shows a schematic front view of the ground electrode shown in FIGS. 2 and 3.
Figure 5:
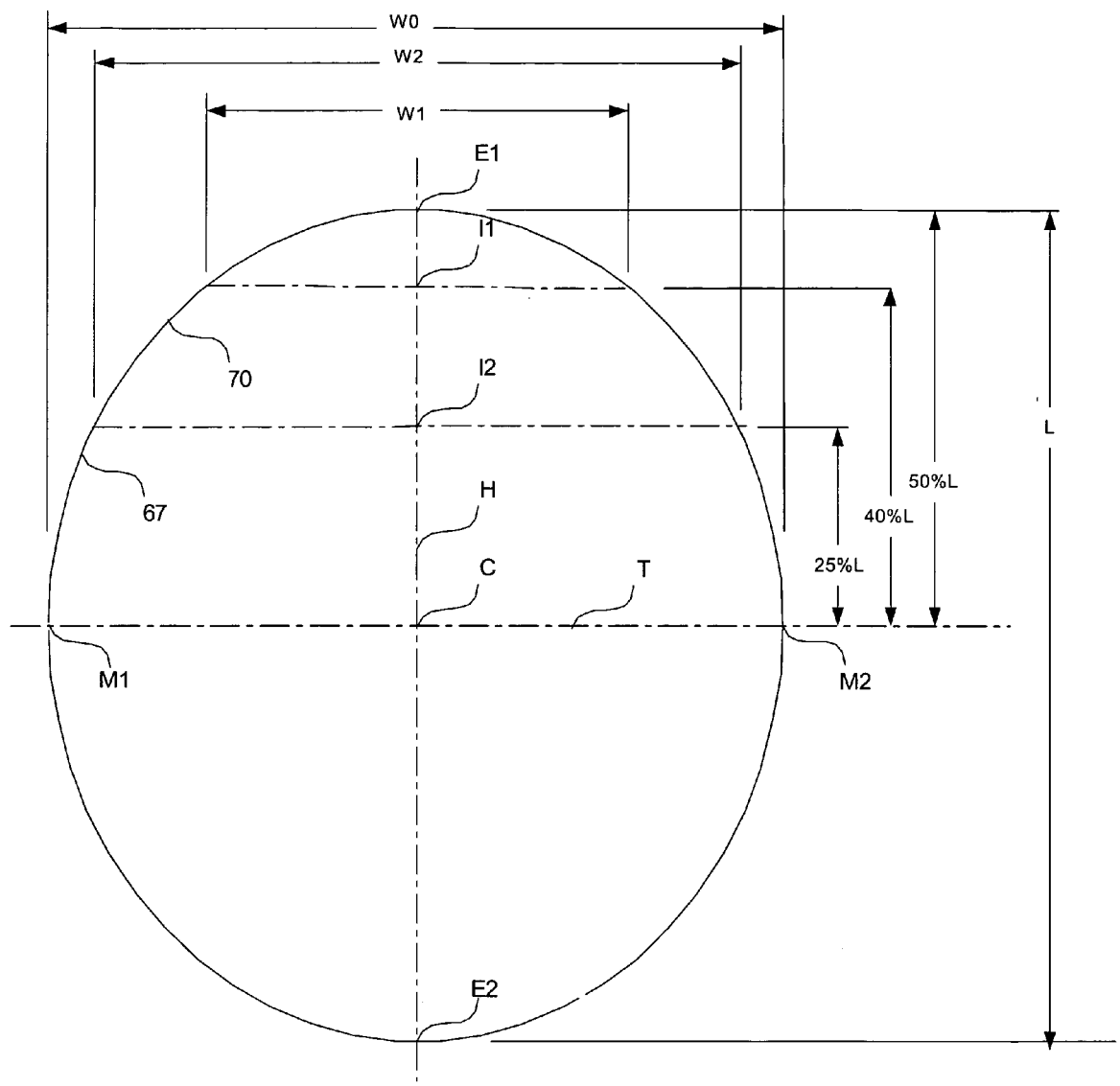
FIG. 5 is a schematic diagram of the aperture of the electrode of FIG. 4.
Figure 6:
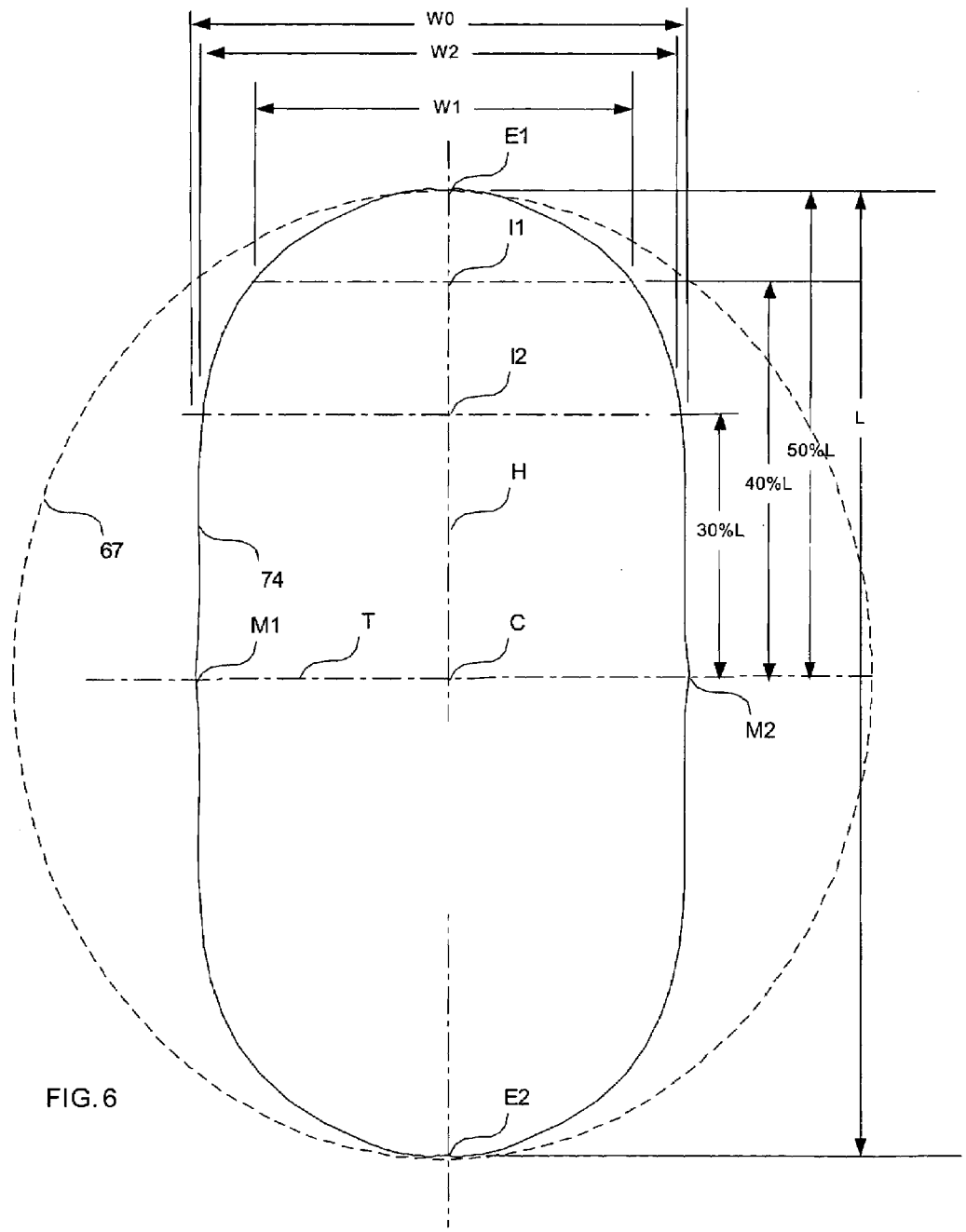
FIG. 6 is a schematic diagram of an alternative embodiment of an aperture for a deceleration electrode.

As explained in great detail below, one or more of the apertures 62, 63 and 67 of the deceleration electrodes 60, 61 and 65, respectively, can be shaped in a manner which can improve performance of the ion implanter 1. For example, FIGS. 4 and 5 show in schematic form the face of the aperture 67 of the ground plate electrode 65. In the illustrated embodiment, the aperture 67 is generally elliptical in shape and conforms generally to the shape of the beam 146 passing through the aperture 67. In contrast, it is believed that the apertures of prior art deceleration electrodes were often generally rectangular in shape as schematically depicted in FIG. 1.

It has been found by the present inventors that an elliptical or similar shape can increase beam transmission through the deceleration assembly electrodes while maintaining good beam transmission. It is further believed that an elliptical or similar shape can reduce aberrations in the beam related to the detailed geometry of the electric fields within and between the apertures in the electrodes of a deceleration electrode assembly of an ion implanter.

The apertures 63 and 67 formed in the field electrode 61 and the plate electrode 65 are each made larger than the beam cross-sectional area at these apertures. The ion beam can pass straight through without substantially clipping the electrodes 61, 65 and substantially most or all the beam current can be transmitted. For a given mass of ion and distance between each of the apertures 63, 67 and the analyzing magnet 5, the beam cross-sectional area will depend on such factors as the ion beam generator and magnet optics, the resolving power of the magnet and the width of the mass resolving slit, each of which can be used to control the beam cross-sectional area at the retardation apparatus and the target substrate. It is appreciated that in some applications, it may be appropriate for one or more of the electrode apertures to be smaller than the beam cross-sectional area.

In the illustrated embodiments, the beam apertures formed in the field electrode 61 and the ground electrode 65 are elongated to conform better to the cross-sectional shape of the beam. Thus, the length L of the aperture 67 of the electrode 65 is greater than the width W of the aperture 67 as shown in FIG. 5. As used herein, the term "length" refers to a measurement in the direction of elongation of the aperture and the term "width" refers to a measurement in a direction transverse to the direction of elongation. In one embodiment, the beam aperture 63 of the field electrode 61 and the beam aperture 67 of the apertured plate electrode 65 have dimensions around 90 mm in length and a width to length ratio of about 0.85. Another example of a suitable elliptical aperture has dimensions dose to 70 mm in length with a width to length ratio of about 0.75. It is believed that a width to length ratio within a range of approximately 0.2–1 or 0.5–1 may be suitable for a number of applications, depending upon the particulars of each application. It should be appreciated that the direction of elongation may be in a vertical, horizontal or other direction, and that the aperture may be wider than it is tall. Thus, the width to length ratio within a range of approximately 0.2–1.5 may be suitable for a number of applications.

In the embodiment of FIG. 5, aperture 67 has a periphery 70 which defines a center point C. A longitudinal axis H passes through the center C and two aperture end points E1 and E2 at opposite ends of the periphery 70. The maximum length L of the aperture 67 is measured along the axis H between the aperture end points E1 and E2. A transverse axis T also passes through the center point C and two aperture midpoints M1 and M2 at opposite sides of the aperture 67. The maximum width W of the aperture 67 is measured along the axis T between the side points M1 and M2.

It is seen that the width of the aperture decreases monotonically from center point C (having the maximum width W0 measured along the transverse axis T between the side midpoints M1, M2), to each aperture endpoint E1, E2. In addition, the average width of the aperture is less than the maximum width W0 of the aperture 67. In the illustrated embodiment, an axis segment extends 40% of the length L of the aperture 67 from the aperture center C to an intermediate point I1 at the end of the segment. The width of the aperture 67 as measured at the intermediate point I1 is indicated by the width W1. The width of the aperture 67 as measured at a second intermediate point I2 along the axis H between the center C and the intermediate point I1 is indicated by the width W2. The average width of the aperture 67 measured at each point from the center C to the intermediate point I1 is substantially less than the maximum width W0 of the aperture 67. In various embodiments, the average width of the aperture as measured along the points of this segment may be typically in a range of 50–98% of the maximum width, for example, depending upon the application.

In contrast, FIG. 1 shows a prior art deceleration electrode aperture 72 which is generally rectangular in shape although slightly rounded at the corners such as corner K1. This elongated aperture 72 defines a center point C, longitudinal axis H, transverse axis T, aperture end points E1, E2 along the longitudinal axis H and aperture midpoints M1, M2 along the transverse axis T. An axis segment extends 40% of the length L of the aperture 72 from the aperture center C to an intermediate point I1 at the end of the segment. The width of the aperture 72 as measured at the intermediate point I1 is indicated by the width W1. The width of the aperture 72 as measured at a second intermediate point I2 along the axis H between the center C and the intermediate point I1 is indicated by the width W2. These widths, W0, W1 and W2 of the aperture 72 are substantially equal. Indeed, the average width of the aperture 72 measured at each point from the center C to the intermediate point I1 is substantially equal to the maximum width W0 of the aperture 72.

It is appreciated that aperture shapes which are similar to elliptical may increase beam transmission, reduce aberrations in the electrode electric field or provide other benefits. For example, in one embodiment, an elongated aperture 74 (FIG. 6) which defines a center point C, longitudinal axis H, transverse axis T, aperture end points E1, E2 and aperture midpoints M1, M2, may be nonelliptical but the width of the aperture nonetheless decreases monotonically from the side midpoints M1, M2 to each aperture end point E1, E2 in a manner similar to that of the aperture 67 (shown in phantom).

Moreover, an axis segment extends 40% of the length L of the aperture 74 from the aperture center C to an intermediate point I1 at the end of the segment. The width of the aperture 74 as measured at the intermediate point I1 is indicated by the width W1. The width of the aperture 74 as measured at a second intermediate point I2 along the axis H between the center C and the intermediate point I1 is indicated by the width W2. The average width of the aperture 74 measured at each point from the center C to the intermediate point I1 is substantially less than the maximum width W0 of the aperture 74.

In some applications, any of the electrode apertures 62, 63 and 67 may be generally circular (although they can be elliptical or other shapes as described and claimed herein) having a diameter of around 75 mm for example. In other applications, the aperture 62 of the deceleration electrode 60 provides an example of a noncircular, nonelongated aperture which is believed to improve ion implanter performance for some embodiments, depending upon the particular application. For example, in the embodiment shown in FIG. 7, the aperture 62 is partially square in shape and has four gradually rounded corners. This shaped aperture may be suitable for applications in which the ground plate electrode 65 has a smaller aspect such as 85 by 65 mm, for example.

Figure 7:
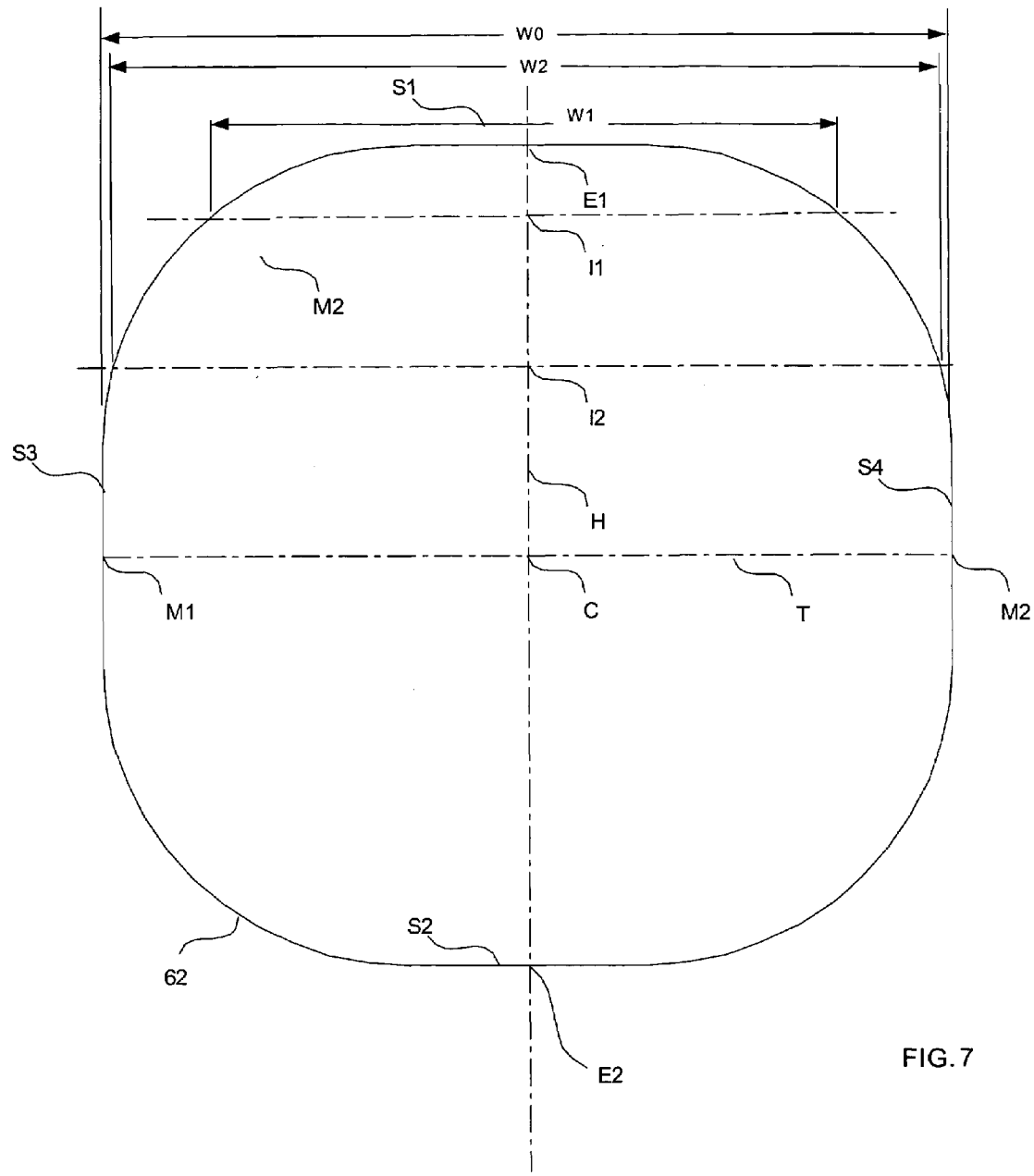
FIG. 7 is a schematic diagram of another alternative embodiment of an aperture for a deceleration electrode.

The aperture 62 of FIG. 7 defines a center point C. A first axis H passes through the center C and orthogonally through two opposite sides S1, S2 at two aperture end points E1 and E2. The length L of the aperture 62 is measured along the axis H between the aperture endpoints E1 and E2. An orthogonal transverse axis T also passes through the center point C and two aperture midpoints M1 and M2 at opposite sides S3, S4 of the aperture 67. The maximum width W of the aperture 62 is measured along the axis T between the aperture mid points M1 and M2, and is substantially equal to the length L of the aperture 62 which is 80 mm in the example of FIG. 7. The gradually rounded corners may have a radius of around 20 mm, for example. It is appreciated that the aperture need not be generally square but could have other shapes, such as generally rectangular, for example, and having rounded corners which provide an average aperture width as described herein.

It is seen that the width of the aperture 62 decreases monotonically from the maximum width W0 measured along the transverse axis T at the side midpoints M1, M2, to each aperture endpoints E1, E2. In addition, the average width of the aperture is less than the maximum width W0 of the aperture 62. In the illustrated embodiment, an axis segment extends 40% of the length L of the aperture 62 from the aperture center C to an intermediate point I1 at the end of the segment. The width of the aperture 62 as measured at the intermediate point I1 is indicated by the width W1. The width of the aperture 62 as measured at a second intermediate point I2 along the axis H between the center C and the intermediate point I1 is indicated by the width W2. The average width of the aperture 62 measured at each point from the center C to the intermediate point I1 is substantially less than the maximum width W0 of the aperture 62.

In the embodiments of FIGS. 4–7, the apertures 62, 63, 67 and 74 are each symmetrical about each axis described above. In addition, the width of each of the apertures 67, 74 decreases monotonically from the side midpoints M1, M2 to each aperture endpoint E1, E2. It is appreciated however, that other apertures which are not symmetrical or do not have monotonically decreasing widths, may nonetheless provide improved ion implanter performance in accordance with described embodiments. For example, elongated apertures which have relatively smoothly changing widths such that relatively sharp corners have been reduced or eliminated are believed to improve ion implanter performance.

In one embodiment, the aperture 67 formed in the final apertured electrode 65 is smaller (e.g. 85 by 65 mm) than the aperture 63 of the field electrode 61 (e.g. 95 by 80 mm) in both length L and width W to provide enhanced screening of the beam neutralizing apparatus 13 from the electric field originating at the field electrode 61. The fractional reduction in the aperture width between the field electrode and final apertured plate electrode 65 is greater than the fractional reduction in aperture height between the field and final apertured electrode. In a manner similar to that described in U.S. Pat. No. 5,932,882, as the ion beam passes through the mass resolving slit, the beam has a pencil-like cross-sectional geometry so that the beam tends to expand laterally at a faster rate than it does vertically due to space charge effects. The larger reduction between the widths of the apertures intensifies the focusing force in the lateral direction across the width of the ion beam to counteract the higher expansion rate in this direction. The beam aperture configuration of the final apertured plate electrode 65 and the field electrode 61 increases the focusing capacity of the deceleration lens so that the potential of the field electrode relative to the first and final apertured electrodes necessary to provide adequate focusing of the beam can be reduced, thereby reducing the energy briefly attained by the ion beam above the transport energy on passing through the field electrode aperture. This in turn reduces the energy of fast neutrals created in this region by charge exchange with residual gas atoms.

The diameter of the field electrode 61, the plate electrode 65 and the prefocusing electrode 60 are about 250, 200 and 225 mm, respectively, in this example. The electrodes may each be made of graphite or other suitable material.

In the illustrated embodiment, the ion beam generator 3 comprises an ion source including an arc chamber having an exit aperture formed in the front face thereof. An extraction electrode assembly 20 includes a number of electrodes (such as two or three, for example) which are spaced from the exit aperture. The extraction assembly 20 extract ions from the arc chamber and forms an ion beam. The extraction electrode which is closest to the exit aperture of the arc chamber serves as a suppression electrode to prevent electrons forward of the beam generator from flowing to the arc chamber.

A flight tube positioned between two poles of the mass analyzing magnet 5, receives the ion beam from the beam generator 3. The transport energy of the ion beam is a function of the potential difference between the flight tube and the ion source. In this particular embodiment, the magnetic field strength of the analyzing magnet and the energy of the ion beam through the magnet are chosen so that ions having an appropriate mass and charge state are deflected through approximately 90 degrees for passage through the ion selector 7, the electrode assembly 9 and the plasma flood generator 13 to the wafer. The flight tube is configured accordingly, with the analyzing magnet exit aperture being approximately orthogonal to the magnet entrance aperture.

The ion selector 7 comprises a series of discrete elements which are spaced apart along the beam and define a series of apertures which, in combination, select ions of the correct mass and charge state to be implanted in the target substrate while rejecting other spatially resolved ions which pass through the analyzing magnet 5. In this particular embodiment, the ion selector 7 comprises a plate electrode which rejects most of the unwanted ion species exiting from the magnet, a pair of elements which together define a variable width mass resolving slit which passes only the selected ion specie, and a further element which defines the height of the ion beam. However, the number of mass resolving elements and their configuration may be varied.

The ion selector assembly is housed in a chamber which forms part of the flight tube and which is disposed between the magnet and the electrode assembly 9. The flight tube including the mass resolving chamber provides the means by which the beam is transported from the ion beam generator to the electrode assembly 9. The mass resolving chamber wall comprises a part which extends in the direction of the beamline and defines a generally cylindrical envelope, and a transverse part adjacent the cylindrical part which constitutes a plate aperture disposed transverse to the beam line and defines an aperture through which the beam can pass, the aperture being adjacent to the final element of the ion selector 7. The transverse part provides an electrostatic screen for screening the ion selector 7 from electric fields originating downstream of the ion selector.

In this particular embodiment, a vacuum port is formed in the chamber wall near the analyzing magnet 5 which is connected to a vacuum pump for evacuating the chamber, although in another embodiment this vacuum port may be omitted. A screening assembly is positioned between the exit aperture of the mass resolving chamber and the electrode assembly 9 to reduce penetration of the electric field from the electrode assembly 9 into the mass resolving chamber through the exit aperture. The screening assembly comprises a cylindrical electrode, and a field defining plate electrode. The screening assembly apertured plate electrode is located upstream of the first element of the deceleration lens 60 to provide further screening of the ion selector 7 from electric fields generated downstream of the ion selector 7 and in particular from fields originating at the field electrode 61. In this particular embodiment, the additional screening plate electrode is mounted on stand-offs extending upstream from the first element 60 of the deceleration lens.

The cylindrical electrode of the screening assembly is arranged coaxially with the exit aperture of the mass resolving chamber and with one end positioned adjacent and connected to the transverse part (or downstream end) of the mass resolving chamber wall. The screening assembly cylindrical electrode extends downstream of the mass resolving chamber and may have an inwardly extending radial flange formed at its downstream end to provide additional screening and to allow the fitting of the first electrode of the deceleration lens 60. The apertured plate electrode 60, containing the aperture 62 is mounted on the downstream end of the screening cylinder. The latter also encloses the additional screening plate electrode. In this embodiment, the screening assembly cylinder, the first element of the deceleration lens 60 and screening assembly plate electrode are all electrically connected to the flight tube. The flight tube and target chamber are separated by an insulator as are the ion generating system and the flight tube.

The screening assembly field defining plate electrode, which may or may not be used, comprises a circular plate with an aperture formed in the center thereof. The field defining plate electrode is mounted within and supported by the screening assembly cylindrical electrode and is positioned about midway between the ends of the cylindrical electrode (although this may vary) and transverse to beam axis. The aperture of the screening assembly electrode may be elliptical, rectangular or square and, in one embodiment may taper gently outwards towards the electrode assembly 9. In this example, the aperture is square and has a width of about 60 mm. The screening assembly cylindrical electrode and the field defining plate electrode may each be made of graphite or other suitable material.

In this embodiment, the plasma injector 13 comprises a plasma flood system which introduces low energy electrons and ions into the ion beam near the target. The plasma flood system includes a guide or confinement tube through which the ion beam can pass from the plate electrode aperture 67 to the target substrate 12, and which both maintains electrons from the plasma flood system in the vicinity of the ion beam and screens the portion of the ion beam between the plate electrode aperture and the wafer from stray electric fields. An apertured plate electrode of the generator 13 is positioned at the upstream end of the confinement tube, adjacent the apertured plate electrode of the deceleration assembly 9 to provide additional screening of the interior of the confinement tube from electric fields from the field electrode 61.

In this embodiment, the ion implanter further comprises an ion source voltage supply for biasing the ion source, a suppression electrode voltage supply for biasing the suppression electrode, a flight tube voltage supply 175 for biasing the flight tube, the mass resolving chamber, the screening assembly, and the appropriate electrodes of the extraction assembly 20. A field electrode voltage supply 177 biases the field electrode 61. The prefocusing electrode 60, which forms the first electrode in the deceleration lens assembly 9, is maintained at flight tube potential by a supply 175. In one embodiment, the field electrode 61 is biased to a more negative potential than the electrode 60.

A plasma flood voltage supply biases the electron confining electrode and the apertured screening plate electrode of the plasma flood generator 13. In this embodiment, the apertured plate electrode 65 of the deceleration lens, the target substrate holder 11 and the substrate 12 are maintained at ground potential, which facilitates handling of the target substrate, simplifies the target support assembly, and serves as a convenient reference potential for the other electrodes.

A method of operating the ion implanter to implant ions at low energy will now be described with reference to a specific example for illustrative purposes only. The ion implantation energy is determined by the potential difference between the substrate 12 and the ion source. As the substrate is maintained at ground potential, the ion source voltage supply is biased positively with respect to ground by an amount which corresponds to the desired ion implantation energy. For example, for a 2 keV implant, the ion source voltage supply is biased to +2 kV. The transport energy of the ion beam through the analyzing magnet 5 and the mass resolving chamber, which is also referred to as the extraction energy of the ion beam, is determined by the potential difference between the ion source and the flight tube, which is controlled by the flight tube voltage supply. Thus, for example, to transport the ion beam at an energy of 10 keV through the flight tube, the flight tube is biased at −10 kV relative to the ion source or −8 kV relative to ground. The ion beam is transported with substantially constant energy through the analyzing magnet and different ionic species within the ion beam are resolved spatially by the magnet according to their mass and charge state. The spatially resolved beam then passes into the mass resolving chamber, where the beam first passes through a predefining aperture defined by the plate electrode of the ion selector 7 closest to the analyzing magnet 5. This plate electrode acts as a coarse, first stage filter for the spatially resolved beam and blocks a proportion of the spatially resolved ion species which are not required in the implant. The second and third elements spaced from the analyzing magnet 5, and which are displaced axially from one another along the beamline, define a variable width mass resolving slit, whose position can be varied in a direction transverse to the beamline, for selecting from the filtered beam the ion species to be implanted.

As an example, in a boron implant using $BF_3$ as the feed material, the spatially resolved beam leaving the analyzing magnet may contain $BF_2$, $BF$, $B$ and $F$ ions and the molecular and boron ions will contain either isotope of boron, $^{10}B$ and $^{11}B$. Thus, for a boron-11 implant the predefining element 135 and the mass resolving elements will filter out all ionic species except $^{11}B$.

As the beam traverses the mass resolving chamber, the energy of the beam is maintained constant, in this example 10 keV. The 10 keV mass resolved beam passes through the exit aperture of the mass resolving chamber, through the screening assembly to the electrode assembly 9.

The electrode 61 is biased to a potential that is more negative than that of the mass resolving chamber and therefore the electrode 60. The magnitude of the potential applied to the field electrode 61 is sufficient to establish an electrostatic focusing field in the region of the final aperture 67 of the grounded plate electrode 65. A potential of between −3 kV and −30 kV (although voltages outside this range may be used) and preferably −25 kV with respect to the potential of the plate electrode 65 is sufficient to establish the required focusing field at the final lens aperture 67 to maintain the beam ions within the beam between the final lens aperture 67 and the target substrate.

In the present example, as the mass resolved beam approaches the field electrode 61, the beam is briefly accelerated above the transport (extraction) energy of 10 keV to an energy defined substantially by the potential difference between the ion source and the field electrode 61. The beam passes through the field electrode aperture 63 and is then decelerated to substantially the required implant energy in the gap between the field electrode aperture 63 and the final aperture 67. At the same time, a net focusing force is applied to the ion beam in the region between the screening assembly aperture plate 60 and the plate electrode 65 of the deceleration lens and just beyond.

The ion beam then passes into the region between the final lens aperture 67 and the target substrate. In this region, the ion beam is transported to the substrate at substantially the required implant energy. Expansion of the now low velocity beam is minimized by flooding the beam with low energy electrons by means of the plasma flood system 13. The plasma flood system also minimizes surface charging of the target substrate during ion implantation.

A vacuum port coupled to a vacuum pump, is formed in the wall of the process chamber to allow the process chamber to be evacuated. The opening of the vacuum port is relatively large and extends parallel to the beam line in the region of the target substrate to optimize pumping dose to the target during implantation. The deceleration lens assembly, in particular the region between the field electrode 61 and the second apertured plate electrode 60, is located directly in front of the vacuum outlet port of the process chamber so that the interior of the lens can be evacuated more efficiently, which assists further in minimizing the production of fast neutrals and high energy contamination of the ion beam.

Figure 3:
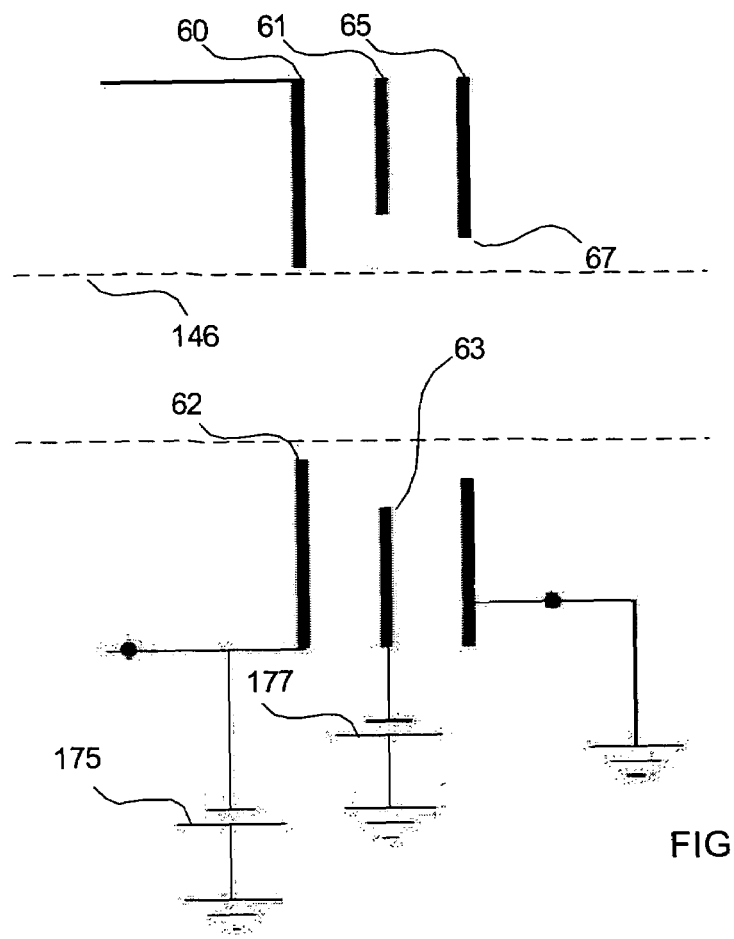
FIG. 3 is a schematic electrical diagram of the deceleration lens electrode assembly of FIG. 2.

Thus, the deceleration lens assembly shown in FIG. 3 is configured and constructed so as to allow the space within the lens to be evacuated effectively so as to minimize the residual gas pressure and, thereby, the production of neutrals including those of energy above the implant energy.

In the illustrated embodiment, the beam width profile changes along the beam line as the beam passes from the analyzing magnet 5 through the deceleration lens assembly to the target substrate 12. The magnet optics bring the ion beam to a narrow focus at the mass resolving slit defined by the mass resolving elements. As the ion beam passes through the mass resolving slit, and through the beam apertures of the mass resolving chamber and additional screening plate electrode, the beam width gradually expands. As the beam approaches the beam aperture 62 of the electrode 60, the electric field between the field electrode 61 and the apertured plate electrode 60 initially applies a force to the ion beam which is accelerated above the transport energy.

As the ion beam passes through the field electrode 61 into the gap between the field electrode 61 and the final apertured plate electrode 65, the beam is decelerated to the desired implant energy and the electric field between these electrodes applies a focusing force to the ion beam so that the beam width narrows to pass through the beam aperture 67 of the final apertured plate electrode 65. Finally, the ion beam passes into the electron confinement tube of the neutralizing apparatus 13 via the beam aperture of the screening plate electrode to the target.

Referring again to FIG. 2, the deceleration lens assembly 9, the plasma flood system 13 and the target substrate support 11 are all housed within a process chamber which is positioned adjacent the mass resolving chamber and communicates with the mass resolving chamber through an aperture formed in the front end section of the mass resolving chamber. The screening cylinder between the front end wall of the mass resolving chamber and the apertured plate electrode 60 screens the ion beam from stray electric fields in the process chamber. The mass resolving chamber wall is electrically insulated from the process chamber wall by an electrically insulating member which forms part of the wall of the process chamber. The beamline (flight tube) is insulated from the ion source in a similar manner.

A cylindrical flange may be provided to extend axially from the final apertured plate electrode 65 towards the field electrode 61. The cylindrical flange and the first apertured plate electrode 65 can form a shield around the ion beam and the field electrode 61, to confine the electric field established by the potential difference applied between the field electrode 61 and the final apertured plate electrode 65, thereby preventing charged particles near the target substrate 12 from flowing upstream to the field electrode 61, and at the same time screening the ion beam from any stray electric fields present in the process chamber, which might otherwise upset the charge balance in the ion beam causing loss of beam current.

The field electrode 61 can be located inside the flange so that the flange surrounds the outer periphery of the field electrode 61. In this embodiment, the field electrode 61 is mounted in and supported by the cylindrical screening flange via a plurality of stand-offs which are positioned radially around the periphery of the field electrode 61. The field electrode and the final apertured plate electrode assembly is mounted on the process chamber wall by a plurality of pillars. In this embodiment, the cylindrical screening flange extends a minimal distance beyond the upstream face of the field electrode 61.

In other embodiments, the apertured plates or electrodes and the focusing or field electrodes may have any suitable shape and configuration and each may comprise one or more individual electrodes. For example, the ground electrode may include a cylindrical or ring electrode. In another embodiment, the ground electrode and the plasma flood guide tube may comprise a single electrode or be electrically connected together. In another embodiment, the ground electrode may be arranged so that it can be biased to a potential different from that of the target substrate.

In another embodiment, the focusing or field electrode may comprise an extension of the flight tube and be substantially at the flight tube potential. In this embodiment, the potential difference between the flight tube and the first apertured plate or retardation electrode should be sufficient to apply a focusing force to the ion beam in the retardation zone. An additional electrode upstream of the retardation electrode and within the flight tube and biased at a potential lower than that of the flight tube should be provided to prevent electrons being lost to the retardation electrode.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description.

What is claimed is:

1. An electrode for a deceleration lens assembly for an ion implanter, comprising:

an electrode body which defines an aperture having a periphery, a center, an axis passing through said center and defining a length of said aperture along said axis, said axis comprising a first axis segment extending from the center of said aperture toward the periphery of said aperture along said axis and having a length in the range of 20–40% of said aperture length, wherein the average width of the aperture measured at points along said axis segment is less than the width of said aperture measured at the center of said aperture.

2. The electrode of claim 1 wherein the average width of the aperture measured at points along said axis segment is within a range of 50–98% of the width of said aperture measured at the center of said aperture.

3. The electrode of claim 1 wherein the width of the aperture as measured at points along said axis segment decreases monotonically from the center of said aperture to the end of said axis segment.

4. The electrode of claim 1 wherein said aperture is elongated.

5. The electrode of claim 1 wherein said aperture is noncircular.

6. The electrode of claim 4 wherein said aperture is elliptical and said electrode is one of a prefocusing electrode and a focusing electrode.

7. The electrode of claim 1 wherein the aperture has a maximum width and a maximum length and the ratio of the aperture maximum width to the aperture maximum length is within a range of 0.2–1.5.

8. The electrode of claim 1 wherein said aperture has four sides and four corners wherein each corner joins two adjacent sides and wherein each corner is rounded in shape.

9. The electrode of claim 8 wherein the four sides are each of equal length.

10. A method of forming an ion beam for implanting material into a semiconductor, comprising:

passing an ion beam through an aperture of an electrode body of an electrode of a deceleration lens assembly wherein the aperture has a periphery, a center, an axis passing through said center and defining a length of said aperture along said axis, said axis comprising a first axis segment extending from the center of said aperture toward the periphery of said aperture along said axis and having a length in the range of 20–40% of said aperture length, wherein the average width of the aperture measured at points along said axis segment is less than the width of said aperture measured at the center of said aperture; and applying a potential to said body to produce an electric field adjacent said aperture to change the velocity of at least some ions of the ion beam, wherein said electric field has properties which are a function of the shape of the aperture.

11. The method of claim 10 wherein the average width of the aperture measured at points along said axis segment is within a range of 50–98% of the width of said aperture measured at the center of said aperture.

12. The method of claim 10 wherein the width of the aperture as measured at points along said axis segment decreases monotonically from the center of said aperture to the end of said axis segment.

13. The method of claim 10 wherein said aperture is elongated.

14. The method of claim 10 wherein said aperture is noncircular.

15. The method of claim 13 wherein said aperture is elliptical.

16. The method of claim 10 wherein the aperture has a maximum width and a maximum length and the ratio of the aperture maximum width to the aperture maximum length is within a range of 0.2–1.5.

17. The method of claim 10 wherein said aperture has four sides and four corners wherein each corner joins two adjacent sides and wherein each corner is rounded in shape.

18. The method of claim 17 wherein the four sides are each of equal length.

19. An ion implanter for implanting material in a semiconductor, comprising:
    a holder adapted to hold at least one semiconductor;
    an ion beam generator adapted to generate a beam of ions; and
    a deceleration lens assembly adapted to control the energy of the ion beam before implantation into the semiconductor, the assembly including an electrode having a body which defines an aperture having a periphery, a center, an axis passing through said center and defining a length of said aperture along said axis, said axis comprising a first axis segment extending from the center of said aperture toward the periphery of said aperture along said axis and having a length in the range of 20–40% of said aperture length, wherein the average width of the aperture measured at points along said axis segment is less than the width of said aperture measured at the center of said aperture.

20. The ion implanter of claim 19 wherein the aperture is elongated, the average width of the aperture measured at points along said axis segment is within a range of 50–98% of the width of said aperture measured at the center of said aperture and wherein the width of the aperture as measured at points along said axis segment decreases monotonically from the center of said aperture to the end of said axis segment.

21. The ion implanter of claim 20 wherein said aperture is elliptical.

22. The ion implanter of claim 20 wherein said aperture is noncircular.

23. The ion implanter of claim 19 wherein the aperture has a maximum width and a maximum length and the ratio of the aperture maximum width to the aperture maximum length is within a range of 0.2–1.5.

24. The ion implanter of claim 19 further comprising a magnet positioned adjacent the ion beam generator and adapted to spatially resolve the beam ions according to their mass; and
    an ion selector disposed adjacent the analyzing magnet and adapted to select a specie of ions and to reject other ions in the spatially resolved beam from the magnet.

25. An electrode for a deceleration lens assembly for an ion implanter, comprising:
    an electrode body which defines an elliptical aperture having a periphery, a center, an axis passing through said center and defining a length of said aperture along said axis, said axis comprising a first axis segment extending from the center of said aperture toward the periphery of said aperture along said axis and having a length in the range of 20–40% of said aperture length, wherein the average width of the aperture measured at points along said axis segment is within a range of 50–98% of the width of said aperture measured at the center of said aperture, wherein the width of the aperture as measured at points along said axis segment decreases monotonically from the center of said aperture to the end of said axis segment, and wherein the aperture has a maximum width and a maximum length and the ratio of the aperture maximum width to the aperture maximum length is within a range of 0.2–1.5.

* * * * *